(12) United States Patent
Morimoto et al.

(10) Patent No.: US 7,714,413 B2
(45) Date of Patent: May 11, 2010

(54) SEMICONDUCTOR DEVICE AND METHOD OF MANUFACTURE THEREOF

(75) Inventors: Noboru Morimoto, Tokyo (JP);
Masahiko Fujisawa, Tokyo (JP);
Daisuke Kodama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 79 days.

(21) Appl. No.: 11/551,042

(22) Filed: Oct. 19, 2006

(65) Prior Publication Data

US 2007/0090447 A1 Apr. 26, 2007

(30) Foreign Application Priority Data

Oct. 25, 2005 (JP) .............................. 2005-309745

(51) Int. Cl.
*H01L 23/544* (2006.01)
(52) U.S. Cl. ................... 257/620; 257/758; 257/762; 257/E23.145
(58) Field of Classification Search ............... 257/316, 257/211, 700, 620
See application file for complete search history.

(56) References Cited

U.S. PATENT DOCUMENTS

| | | | | |
|---|---|---|---|---|
| 7,256,474 B2* | 8/2007 | Wakayama et al. | ......... | 257/620 |
| 2002/0125577 A1* | 9/2002 | Komada | ..................... | 257/774 |
| 2003/0218254 A1* | 11/2003 | Kurimoto et al. | ........... | 257/758 |
| 2004/0084761 A1* | 5/2004 | Karthikeyan et al. | ........ | 257/700 |
| 2004/0084777 A1* | 5/2004 | Yamanoue et al. | .......... | 257/758 |

FOREIGN PATENT DOCUMENTS

| | | |
|---|---|---|
| JP | 2000-277465 | 10/2000 |
| JP | 2004-296904 | 10/2004 |

\* cited by examiner

*Primary Examiner*—Kenneth A Parker
*Assistant Examiner*—Jose R Diaz
(74) *Attorney, Agent, or Firm*—Oblon, Spivak, McClelland, Maier & Neustadt, L.L.P.

(57) ABSTRACT

A seal ring is provided between a region where a circuit is formed on a semiconductor substrate and a dicing region. The seal ring has a portion where sealing layers of which the cross sectional form is in T-shape are layered and a portion where sealing layers of which the cross sectional form is rectangular are layered.

6 Claims, 11 Drawing Sheets

F I G . 1 2
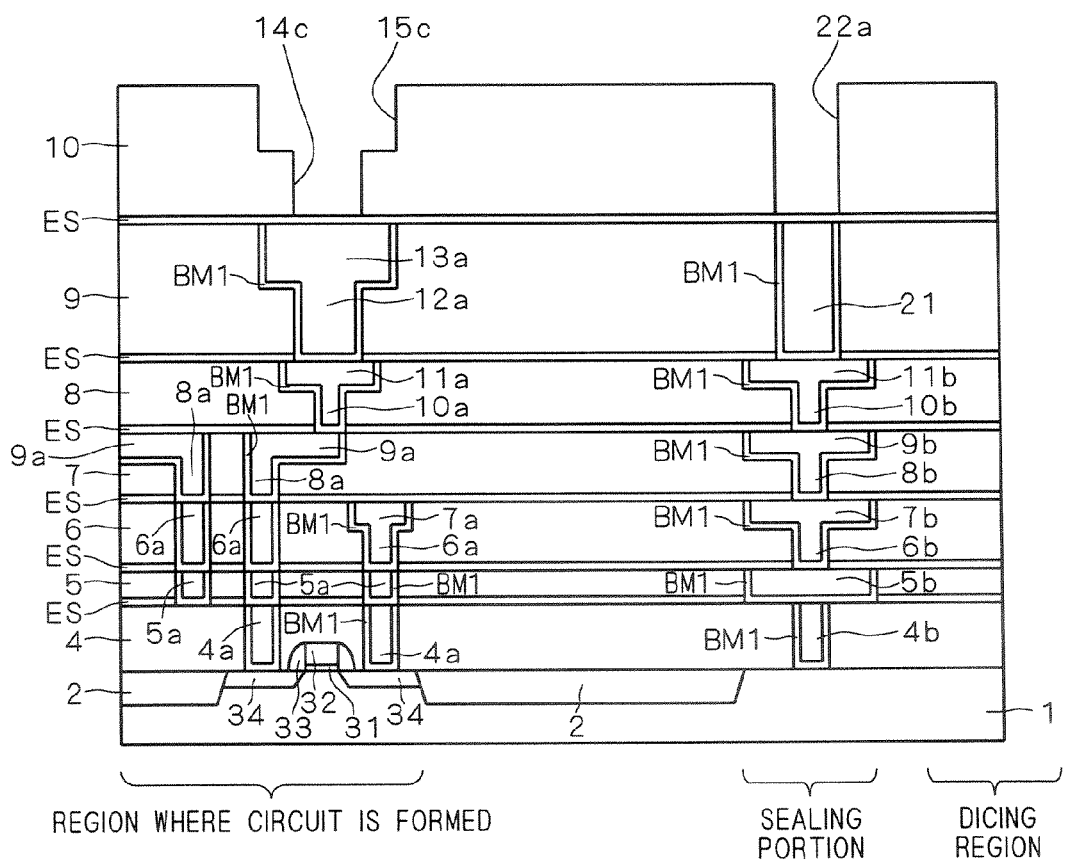

SEMICONDUCTOR DEVICE AND METHOD OF MANUFACTURE THEREOF

BACKGROUND OF THE INVENTION

1. Field of the Invention

The present invention relates to a semiconductor device and a method of manufacture thereof, and in particular, to a semiconductor device having a seal ring provided so as to surround the periphery of a semiconductor integrated circuit, and a method of manufacture thereof.

2. Description of the Background Art

In a manufacturing process for a semiconductor device, a semiconductor substrate is cut along dicing line portions, and thereby, is separated into individual LSI chips after a plurality of semiconductor elements have been formed on the semiconductor substrate. At this time, multiple interlayer insulating films layered during the process for forming the semiconductor elements are exposed from the cut section of the dicing line portions.

These interlayer insulating films and interfaces between the interlayer insulating films become paths for moisture to penetrate, and there is a possibility that these may become a problem in terms of reliability in such a manner that these may cause a malfunction of the semiconductor device.

In addition, cracking may occur in the interlayer insulating films due to stress at the time of dicing or stress caused by a difference in the coefficient of thermal expansion between the interlayer insulating films and the molding resin that is used at the time of the packaging of the LSI chip, and this cracking may become a path for moisture to penetrate.

As a measure for these, a configuration is adopted where a structure in loop form, which is referred to as a seal ring or a guard ring, is provided so as to surround the periphery of a region where a semiconductor integrated circuit is formed.

The seal ring is formed in the process for forming wiring layers or contact portions, which are formed in the region where the semiconductor integrated circuit is formed, and the same material for the wiring layers and the contact portions is used.

FIG. 17 is a cross sectional diagram showing the configuration of a seal ring according to a background technology of this invention. As shown in FIG. 17, a seal ring 90 is provided between the region where a circuit is formed on a semiconductor substrate 1 and the dicing region.

FIG. 17 shows, as an example of a semiconductor element that is provided on the semiconductor substrate 1, such as a silicon substrate, a configuration where a MOS transistor Q1 is provided in an active region defined by an isolation insulating film 2.

The MOS transistor Q1 is formed so as to have a gate electrode 32 provided on the semiconductor substrate 1 with a gate insulating film 31 in between, side wall insulating films 33 provided on the sides of the gate electrode 32, and source/drain layers 34 provided in the surface of the semiconductor substrate 1 on both sides and outside of the gate electrode 32 in the direction of the gate length.

Additionally, an interlayer insulating film 4 is provided on the semiconductor substrate 1 so as to cover the MOS transistor Q1, and on top of that, interlayer insulating films 5, 6, 7, 8, 9, 10 and 11 are sequentially provided so as to form a multilayer structure. Here, etching stopper films ES are provided between the respective interlayer insulating films.

Additionally, wiring layers and contact portions which are electrically connected to the MOS transistor Q1 are provided to these interlayer insulating films 4 to 11 in the region where the circuit is formed so as to form multilevel wiring layers.

That is to say, two contact portions 4a are provided so as to penetrate the interlayer insulating film 4 and reach the source/drain layers 34.

In addition, a plurality of wiring layers 5a are provided so as to penetrate the interlayer insulating film 5 and the etching stopper film ES on top of the interlayer insulating film 4. Two out of the plurality of wiring layers 5a are formed so as to be connected to the two contact portions 4a provided in the interlayer insulating film 4.

In addition, a plurality of contact portions 6a are provided so as to penetrate the interlayer insulating film 6 and the etching stopper film ES on top of the interlayer insulating film 5, and two of the plurality of contact portions 6a are formed so as to be connected to the wiring layers 5a, which are electrically connected to the source/drain layers 34 of the MOS transistor Q1.

Additionally, one of the plurality of contact portions 6a, which is electrically connected to one of the source/drain layers 34 of the MOS transistor Q1, is connected to a wiring layer 7a, which is provided in the interlayer insulating film 6. The wiring layer 7a is provided on top of one of the contact portions 6a, and the wiring layer 7a and the contact portion 6a are formed in accordance with a dual damascene method.

In addition, two contact portions 8a are provided so as to penetrate the interlayer insulating film 7 and the etching stopper film ES on top of the interlayer insulating film 6, and one contact portion 8a is formed so as to be connected to the contact portion 6a, which is electrically connected to the source/drain layer 34 of the MOS transistor Q1.

Additionally, the two contact portions 8a are connected to wiring layers 9a, which are provided in the interlayer insulating film 7. The wiring layers 9a are provided on top of the contact portions 8a and the wiring layers 9a, and the contact portions 8a are formed in accordance with a dual damascene method.

In addition, a contact portion 10a is provided so as to penetrate the interlayer insulating film 8 and the etching stopper film ES on top of the interlayer insulating film 7, and this contact portion 10a is formed so as to be connected to the wiring layer 9a, which is electrically connected to the source/drain layer 34 of the MOS transistor Q1.

Additionally, the contact portion 10a is connected to a wiring layer 11a, which is provided in the interlayer insulating film 8. The wiring layer 11a is provided on top of the contact portion 10a, and the wiring layer 11a and the contact portion 10a are formed in accordance with a dual damascene method.

In addition, a contact portion 12a is provided so as to penetrate the interlayer insulating film 9 and the etching stopper film ES on top of the interlayer insulating film 8, and this contact portion 12a is formed so as to be connected to the wiring layer 11a, which is electrically connected to the source/drain layer 34 of the MOS transistor Q1.

Additionally, the contact portion 12a is connected to a wiring layer 13a, which is provided in the interlayer insulating film 9. The wiring layer 13a is provided on top of the contact portion 12a, and the wiring layer 13a and the contact portion 12a are formed in accordance with a dual damascene method.

In addition, a contact portion 14a is provided so as to penetrate the interlayer insulating film 10 and the etching stopper film ES on top of the interlayer insulating film 9, and this contact portion 14a is formed so as to be connected to the wiring layer 13a, which is electrically connected to the source/drain layer 34 of the MOS transistor Q1.

Additionally, the contact portion 14a is connected to a wiring layer 15a, which is provided in the interlayer insulating film 10. The wiring layer 16a is provided on top of the contact portion 14a, and the wiring layer 15a and the contact portion 14a are formed in accordance with a dual damascene method.

Here, barrier metal layers BM1 are provided between the above described contact portions and the interlayer insulating films, as well as between the above described wiring layers and the interlayer insulating films, and thus, the material that forms the contact portions and the wiring layers does not make direct contact with the interlayer insulating films in the configuration.

In addition, a passivation film 19 is provided on top of the interlayer insulating film 11, and a polyimide film 20 is provided on top of the passivation film 19.

The seal ring 90 is formed in the process for forming the above described contact portions and wiring layers, which are formed between the respective interlayer insulating films.

That is to say, a sealing layer 4b is formed in the interlayer insulating film 4 during the process for forming contact portions 4a; a sealing layer 5b is formed in the interlayer insulating film 5 during the process for forming wiring layers 6a; sealing layers 6b and 7b are formed in the interlayer insulating film 6 during the dual damascene process for a contact portion 6a and a wiring layer 7a, respectively; sealing layers 8b and 9b are formed in the interlayer insulating film 7 during the dual damascene process for a contact portion 8a and a wiring layer 9a, respectively; sealing layers 10b and 11b are formed in the interlayer insulating film 8 during the dual damascene process for a contact portion 10a and a wiring layer 11a, respectively; sealing layers 12b and 13b are formed in the interlayer insulating film 9 during the dual damascene process for a contact portion 12a and a wiring layer 13a, respectively; and sealing layers 14b and 15b are formed in the interlayer insulating film 10 during the dual damascene process for a contact portion 14a and a wiring layer 16a, respectively.

Here, the width of the sealing layers 4b, 6b, 8b, 10b, 12b and 14b is narrower than the width of the sealing layers 5b, 7b, 9b, 11b, 13b and 15b respectively formed thereon, and therefore, the cross sectional form of the respective combinations of the sealing layers 4b and 5b, the sealing layers 6b and 7b, the sealing layers 8b and 9b, the sealing layers 10b and 11b, the sealing layers 12b and 13b, as well as the ceiling layers 14b and 15b, is in T-shape.

In addition, a sealing layer 16b is provided so as to penetrate the interlayer insulating film 11 and the etching stopper film ES on top of the interlayer insulating film 10 and reach the sealing layer 15b, and a sealing layer 17b is provided on the interlayer insulating film 11 so as to cover the top portion of the sealing layer 16b.

The sealing layer 17b is formed during the process for forming a wiring layer (not shown), which is the top layer in the region where the circuit is formed, and is formed of, for example, aluminum (Al).

In addition, the sealing layer 16b is formed during the process for forming a contact portion (not shown) for electrically connecting the wiring layer, which is the top layer in the region where the circuit is formed, to the wiring layer 15, and a barrier metal layer BM2 is provided between the sealing layer 16b and the interlayer insulating film.

Here, the sealing layers 4b to 17b are provided so as to be sequentially layered, and the seal ring 90 functions as a barrier against the moisture that has penetrated from the cut section of the exposed interlayer insulating films 4 to 11, and against the spreading of the cracks that have been created due to stress.

In addition, as for the configuration other than that of the above described seal ring 90, Japanese Patent Application Laid-Open No. 2000-277465, for example, discloses a configuration where seal rings are provided in a double structure in such a manner that the outer seal ring, which is close to the dicing portion, has a configuration where conductive layers having the same width are layered from the top layer to the bottom layer, and the inner seal ring is formed in the process for forming the wiring layers and the contact portions.

In addition, Japanese Patent Application Laid-Open No. 2004-296904 discloses a seal ring where conductive layers having the same width are layered from the top layer to the bottom layer in the vicinity of the dicing portion.

In recent years, miniaturization of the structure, increase in the integration and increase in the speed of operation of semiconductor devices have been progressing, and together with these, the importance of reduction in the resistance of wires has been increasing, and copper (Cu) having a relatively low resistance has been used as a wire material.

In the case where Cu is used as the wire material, it is general to form wiring layers and contact portions using a dual damascene method, and as described in reference to FIG. 17, the sealing layers 6b to 15b, from among the sealing layers 4b to 15b that form the seal ring 90, are formed using a dual damascene method.

Here, according to the dual damascene method, holes, which later become contact portions, are created so as to penetrate the interlayer insulating film, and after that, these holes are filled in once with a resin material, and in this state, trenches, which become wiring layers, are created through etching. This is done in order to prevent the already formed wiring layers in the lower layer from being etched.

However, the volume of the sealing layers 6b to 15b, which form the seal ring 90, is large in comparison with the volume of the corresponding contact portions and wiring layers. This is because the sealing layers 6b to 15b are formed so as to surround the region where the circuit is formed.

In particular, the volume of the sealing layers, which are formed in the same process for the contact portions, is extremely large in comparison with the contact portions, and therefore, it is technically difficult to fill the trenches for the formation of these sealing layers with a resin material. In the case where etching is carried out in order to create trenches, which become wiring layers in a state where filling with the resin material is insufficient, there is a possibility that the already formed sealing layers in the lower layer may be partially removed through etching, and in such a case, voids are created between the sealing layers in the upper layer and the sealing layers in the lower layer, making the connection portions of the two fragile, and there is a possibility that the function of the seal ring may deteriorate.

In addition, in these days, the relative dielectric constant of the interlayer insulating films tends to be low, and the adhesiveness between the interlayer insulating films tends to be low together with the lowering of the relative dielectric constant. Here, the configuration of the seal ring 90 or the like, where sealing layers of which the cross sectional form is in T-shape are layered, has effects of preventing the interlayer insulating films from peeling off from each other, though in the case where a seal ring having a structure where conductive layers having the same width are layered from the top layer to the bottom layer is adopted as disclosed in Japanese Patent Application Laid-Open No. 2004-296904, there is a possibility that the above described effects may be reduced.

The present invention is provided in order to solve the above described problems, and an object of the invention is to provide a semiconductor device where the structure of a seal ring is optimized so that a seal ring, which secures the function of a barrier against the penetration of moisture from the cut section along the dicing portion and the spreading of cracks, is provided, as well as a manufacturing method for the same.

SUMMARY OF THE INVENTION

A semiconductor device with a seal ring of which a function as a barrier against the penetration of moisture from the cut section along the dicing portion and the spreading of cracks is secured by optimizing the structure of the seal ring, as well as a manufacturing method for the same, are provided.

A semiconductor device according to an aspect of the present invention includes: a semiconductor integrated circuit provided on a semiconductor substrate; multilevel wiring layers provided above the semiconductor integrated circuit; and a seal ring provided so as to surround the periphery of the above described semiconductor integrated circuit and the above described multilevel wiring layers, wherein the above described seal ring is formed of a layered structure of conductive sealing layers which are respectively provided in a plurality of interlayer insulating films which form the above described multilevel wiring layers, and the layered structure of the above described sealing layers has: a portion where a plurality of first sealing layers of which the cross sectional form is in T-shape are sequentially layered; and a portion where a plurality of second sealing layers of which the cross sectional form is rectangular are sequentially layered.

As described above, the seal ring is formed of a layered body of conductive sealing layers which are respectively provided in a plurality of interlayer insulating films that form multilevel wiring layers, and the layered body of the sealing layers has a portion where a plurality of first sealing layers of which the cross sectional form is in T-shape are layered in sequence and a portion where a plurality of second sealing layers of which the cross sectional form is rectangular are layered in sequence, and thus, a plurality of first sealing layers are layered in sequence on the lower layer side of the multilevel wiring layers and a plurality of second sealing layers are layered in sequence on the upper layer side in the configuration, and thereby, the structure of the seal ring is optimized, the physical strength is increased and a function as a barrier against the penetration of moisture from the cut section along the dicing portion and the spreading of cracks can be secured.

A manufacturing method for a semiconductor device according to another aspect of the present invention includes: (a) the step of forming an etching stopper film and a second interlayer insulating film in sequence on top of a first interlayer insulating film provided above a semiconductor integrated circuit formed on a semiconductor substrate; (b) the step of creating a hole which penetrates the above described second interlayer insulating film and reaches the above described etching stopper film in a region corresponding to a portion of the above described second interlayer insulating film above the above described semiconductor integrated circuit, and creating a trench which surrounds the periphery of a region corresponding to a portion of the above described second interlayer insulating film above the above described semiconductor integrated circuit, and penetrates the above described second interlayer insulating film and reaches the above described etching stopper film; (c) the step of forming a resin layer within the above described hole and the above described trench; (d) after the above described step (c), the step of forming a resist mask having a wiring pattern where an opening is provided above the above described hole and covering the above described trench; (e) the step of creating a wire trench by etching and removing the above described second interlayer insulating film to a predetermined depth using the above described resist mask as a mask; (f) the step of removing the above described etching stopper film at the bottom of the above described hole and at the bottom of the above described trench after removing the above described resist mask and the above described resin layer within the above described hole and the above described trench; and (g) after the above described step (f), the step of filling in the above described wire trench and the above described hole which are connected, as well as the above described trench, with a conductive layer.

As described above, a seal ring of which the cross sectional form is rectangular can be formed in the second interlayer insulating film provided above a semiconductor integrated circuit so as to surround the periphery of the region corresponding to a portion of the second interlayer insulating film above the semiconductor integrated circuit in part of the process for forming wiring layers and contact portions in accordance with a dual damascene method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 to FIG. 14 are cross sectional views for illustrating steps in the manufacture of a semiconductor device according to an embodiment of the present invention;

DESCRIPTION OF THE PREFERRED EMBODIMENTS

Embodiment

Configuration of Device

Figure 1:
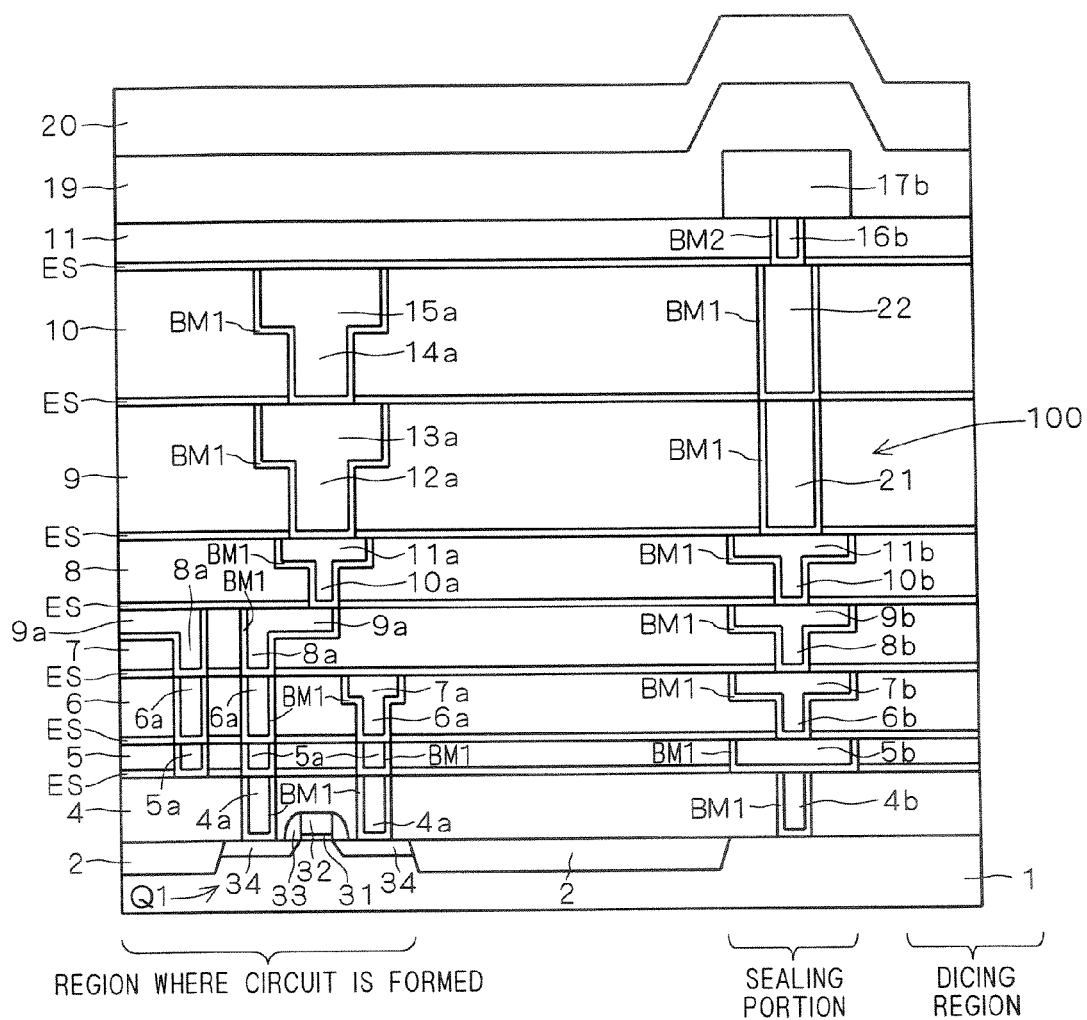
FIG. 1 is a cross sectional view showing the configuration of a semiconductor device according to an embodiment of the present invention.

FIG. 1 is a cross sectional view showing a semiconductor device according to an embodiment of the present invention.

FIG. 1 shows a configuration where a MOS transistor Q1 is provided in an active region defined by an isolation insulating film 2 as an example of a semiconductor element which forms a semiconductor integrated circuit provided on a semiconductor substrate 1, for example a silicon substrate. In addition, a seal ring 100 is provided between the region where the circuit is formed on the semiconductor substrate 1 and the dicing region.

The MOS transistor Q1 is formed so as to have a gate electrode 32 which is provided on the semiconductor substrate 1 with a gate insulating film 31 in between, side wall insulating films 33 which are provided on the sides of the gate electrode 32, and source/drain layers 34 which are respectively provided on the surface of the semiconductor substrate 1, on both sides and the outside of the gate electrode 32 in the direction of the gate length.

Additionally, an interlayer insulating film 4 is provided on top of the semiconductor substrate 1 so as to cover the MOS transistor Q1, and on top of this, interlayer insulating films 5, 6, 7, 8, 9, 10 and 11 are sequentially provided so as to form a multilayer structure.

Here, the interlayer insulating film 4 is formed of a silicon oxide film (TEOS oxide film) using TEOS (tetraethyl orthosilicate), the interlayer insulating films 9 to 11 are formed of an FSG (fluorinated silica glass) having a relative dielectric constant of approximately 3.5 in accordance with, for example, a CVD method, and the interlayer insulating films 5 and 6 to 8 are formed of an SiOC (carbon containing $SiO_2$) film having a relative dielectric constant of no greater than 3.0 in accordance with, for example, a plasma CVD method. Here, etching stopper films ES formed of a silicon nitride film having a relative dielectric constant of approximately 9.0 are provided between the respective interlayer insulating films.

Additionally, wiring layers and contact portions which are electrically connected to the MOS transistor Q1 are provided in these interlayer insulating films 4 to 11, in the region where the circuit is formed.

First, two contact portions 4a are provided in the interlayer insulating film 4 so as to penetrate the interlayer insulating film 4 and reach the source/drain layers 34.

Additionally, a plurality of wiring layers 5a (first layer wires) are provided so as to penetrate the interlayer insulating film 5 and the etching stopper film ES on top of the interlayer insulating film 4, and two out of the plurality of wiring layers 5a are formed so as to be connected to the two contact portions 4a provided in the interlayer insulating film 4.

In addition, a plurality of contact portions 6a are provided so as to penetrate the interlayer insulating film 6 and the etching stopper film ES on top of the interlayer insulating film 5, and two out of the plurality of contact portions 6a are formed so as to be connected to the wiring layers 5a which are electrically connected to the source/drain layers 34 of the MOS transistor Q1.

Additionally, one out of the plurality of contact portions 6a which is electrically connected to one of the source/drain layers 34 of the MOS transistor Q1 is connected to a wiring layer 7a (second layer wire) provided in the interlayer insulating film 6. The wiring layer 7a is provided on top of the contact portion 6a, and the wiring layer 7a and the contact portion 6a are formed in accordance with a dual damascene method.

In addition, two contact portions 8a are provided so as to penetrate the interlayer insulating film 7 and the etching stopper film ES on top of the interlayer insulating film 6, and one contact portion 8a is formed so as to be connected to the contact portion 6a which is electrically connected to the source/drain layer 34 of the MOS transistor Q1.

Additionally, the two contact portions 8a are connected to wiring layers 9a (third layer wires) provided in the interlayer insulating film 7. The wiring layers 9a are provided on top of the contact portions 8a, and the wiring layers 9a and the contact portions 8a are formed in accordance with a dual damascene method.

In addition, a contact portion 10a is provided so as to penetrate the interlayer insulating film 8 and the etching stopper film ES on top of the interlayer insulating film 7, and this contact portion 10a is formed so as to be connected to the wiring layer 9a which is electrically connected to the source/drain layer 34 of the MOS transistor Q1.

Additionally, the contact portion 10a is connected to a wiring layer 11a (fourth layer wire) provided in the interlayer insulating film 8. The wiring layer 11a is provided on top of the contact portion 10a, and the wiring layer 11a and the contact portion 10a are formed in accordance with a dual damascene method.

In addition, a contact portion 12a is provided so as to penetrate the interlayer insulating film 9 and the etching stopper film ES on top of the interlayer insulating film 8, and this contact portion 12a is formed so as to be connected to the wiring layer 11a which is electrically connected to the source/drain layer 34 of the MOS transistor Q1.

Additionally, the contact portion 12a is connected to a wiring layer 13a (fifth layer wire) provided in the interlayer insulating film 9. The wiring layer 13a is provided on top of the contact portion 12a, and the wiring layer 13a and the contact portion 12a are formed in accordance with a dual damascene method.

In addition, a contact portion 14a is provided so as to penetrate the interlayer insulating film 10 and the etching stopper film ES on top of the interlayer insulating film 9, and this contact portion 14a is formed so as to be connected to the wiring layer 13a which is electrically connected to the source/drain layer 34 of the MOS transistor Q1.

Additionally, the contact portion 14a is connected to a wiring layer 15a (sixth layer wire) provided in the interlayer insulating film 10. The wiring layer 15a is provided on top of the contact portion 14a, and the wiring layer 15a and the contact portion 14a are formed in accordance with a dual damascene method.

Here, the above described contact portions and wiring layers are formed of copper (Cu), and barrier metal layers BM1 formed of, for example, TaN, are provided between the contact portions and the interlayer insulating films, as well as between the wiring layers and the interlayer insulating films, so that the material that forms the contact portions and the wiring layers does not make direct contact with the interlayer insulating films in the configuration.

In addition, a passivation film 19 formed from a nitride silicon film through plasma nitrization is provided on top of the interlayer insulating film 11, and a polyimide film 20 is provided on top of the passivation film 19.

Meanwhile, a seal ring 100 is provided in the interlayer insulating films 4 to 11 and the passivation film 19, in the seal ring portion.

The seal ring 100 is formed in the process for forming the above described contact portions and wiring layers in the respective interlayer insulating films.

That is to say, a sealing layer 4b is formed in the interlayer insulating film 4 in the process for forming the contact portion 4a; a sealing layer 5b is formed in the interlayer insulating film 5 in the process for forming the wiring layer 5a; sealing layers 6b and 7b are formed in the interlayer insulating film 6 in the dual damascene process for the contact portion 6a and the wiring layer 7a, respectively; sealing layers 8b and 9b are formed in the interlayer insulating film 7 in the dual damascene process for the contact portions 8a and the wiring layers 9a, respectively; and sealing layers 10b and 11b are formed in the interlayer insulating film 8 in the dual damascene process for the contact portion 10a and the wiring layer 11a, respectively.

Thus, the width of the sealing layers 4b, 6b, 8b and 10b is smaller than the width of the sealing layers 5b, 7b, 9b and 11b respectively formed thereon, and therefore, the cross sectional form of the respective combinations of the sealing layers 4b and 5b, the sealing layers 6b and 7b, the sealing layers 8b and 9b, and the sealing layers 10b and 11b, is in T-shape. Here, integrated sealing layers which are simultaneously formed in the dual damascene process, for example the sealing layers 6b and 7b, the sealing layers 8b and 9b, and the sealing layers 10b and 11b, are in some cases dealt with as one sealing layer.

Here, the width of the sealing layers 4b, 6b, 8b and 10b is set no greater 0.3 μm, and this is so that these can be formed in the process for the contact portions 4a, 6a, 8a and 10a, and thus, the width of the contact portions is prescribed in accordance with the wiring rule.

In this manner, the width of the portion which corresponds to the leg portion of the sealing layers in T-shape is made the same as the width of the contact portions, and thereby, an advantage is gained, such that the manufacture becomes easy.

Here, it is desirable for the width of the sealing layers 5b, 7b, 9b and 11b to be set two or more times greater than the width of the sealing layers 4b, 6b, 8b and 10b.

In addition, the sealing layer 21 is formed in the interlayer insulating film 9 in part of the process for forming the contact portion 12a and the wiring layer 13a in accordance with a dual damascene method, and the sealing layer 22 is formed in the interlayer insulating film 10 in part of the process for forming the contact portion 14a and the wiring layer 15a in accordance with a dual damascene method.

Here, the cross sectional form of the sealing layers 21 and 22 is a rectangle of which the width can be set to approximately 0.3 μm, and this is because these are formed in the process for the contact portions 12a and 14a, respectively, and the width of the contact portions is prescribed in accordance with the wiring rule.

Here, the above described sealing layers are formed of copper (Cu), and barrier metal layers BM1 formed of, for example, TaN, are provided between the sealing layers and the interlayer insulting films, so that the material that forms the contact portions and the wiring layers does not make direct contact with the interlayer insulating films in the configuration.

In addition, a sealing layer 16b is provided so as to penetrate the interlayer insulating film 11 and the etching stopper film ES on top of the interlayer insulating film 10 and reach the sealing layer 15b, and a sealing layer 17b is provided on top of the interlayer insulating film 11 so as to cover the top portion of the sealing layer 16b.

The sealing layer 17b is formed during the process for forming wiring layers (not shown) which are the top layers in the region where the circuit is formed, and is made of, for example, aluminum (Al).

In addition, the sealing layer 16b is formed during the process for forming contact portions (not shown) for electrically connecting a wiring layer which is a top layer in the region where the circuit is formed to the wiring layer 16a, and is made of tungsten (W), while a barrier metal layer BM2 formed of, for example, TiN is provided between the sealing layer 16b and the interlayer insulating film.

Here, the sealing layers 4b to 11b, 21, 22, 16b and 17b are provided so as to be sequentially layered on top of each other, and thus, the seal ring 100 functions as a barrier against moisture that penetrates from the cut section of the interlayer insulating films 4 to 11, which are exposed as a result of dicing, as well as against the spreading of cracks that have been created due to stress.

<Manufacturing Method>

Next, a manufacturing method for the semiconductor device shown in FIG. 1 is descried in reference to FIGS. 2 to 14, which show the manufacturing steps in sequence.

Figure 2:
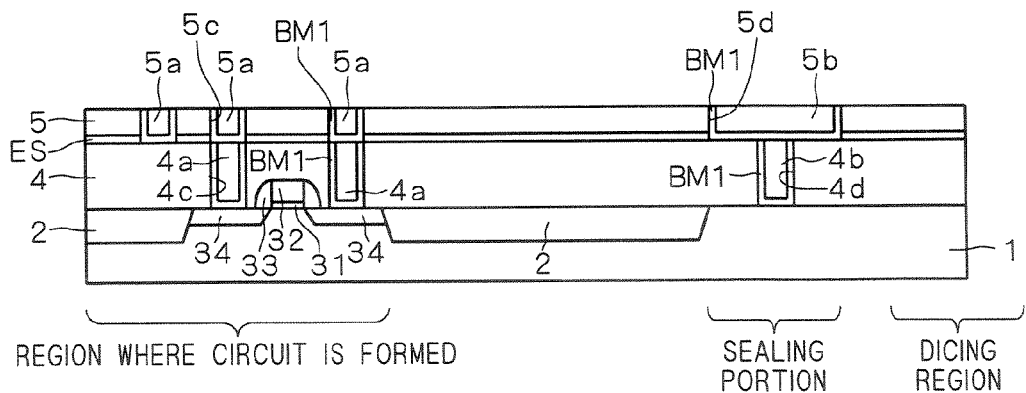

First, in the step shown in FIG. 2, an active region is defined by an interlayer insulating film 2 which is provided on the main surface of a semiconductor substrate 1, and a semiconductor element for the formation of a semiconductor integrated circuit, for example a MOS transistor Q1, is formed in the active region. Here, the semiconductor element, for example the MOS transistor Q1, is formed in accordance with a well known technology, and therefore, the description of the manufacturing method is omitted.

Next, a TEOS oxide film having a relative dielectric constant of approximately 3.5 is formed on top of the semiconductor substrate 1 in accordance with, for example, a CVD method, and thus, an interlayer insulating film 4 is provided.

Then, holes 4c are created so as to penetrate the interlayer insulating film 4 and reach the source/drain layers 34 of the MOS transistor Q1 in the region where the circuit is formed, and a trench 4d is created so as to penetrate the interlayer insulating film 4 and reach the semiconductor substrate 1 in the seal ring portion. Here, the trench 4d is provided so as to surround the region where the circuit is formed.

After that, TaN is formed in accordance with a sputtering method so as to cover the inner surfaces of the holes 4c and the trench 4d, and thus, barrier metal layers BM1 are provided, and subsequently, the holes 4c and the trench 4d are filled in with tungsten (W) in accordance with a CVD method or a plating method, so that contact portions 4a and a sealing layer 4b are respectively formed.

Next, an SiN film is formed so as to cover the entirety of the main surface of the interlayer insulating film 4 in accordance with, for example, a CVD method, and thus, an etching stopper film ES is provided.

After that, an SiOC film is formed on top of the etching stopper film ES in accordance with, for example, a plasma CVD method, and thus, an interlayer insulating film 5 is provided.

Then, a plurality of trenches 5c are provided so as to penetrate the interlayer insulating film 5 and the etching stopper ES on top of the interlayer insulating film 4 in the region where the circuit is formed, and in addition, a trench 5d is provided so as to penetrate the interlayer insulating film 5 and the etching stopper ES on top of the interlayer insulating film 4 and reach the sealing layer 4b in the seal ring portion. Here, the trench 5d is provided so as to surround the region where the circuit is formed in the same manner as the sealing layer 4b. Here, some of the plurality of trenches 5c (two in the figure) are provided so as to reach the contact portions 4a.

After that, TaN is formed as a barrier metal layer BM1 in accordance with a sputtering method so as to cover the inner surfaces of the trenches 5c and the trench 5d, and subsequently, the trenches 5c and the trench 5d are filled in with Cu in accordance with a CVD method or a plating method, and thus, wiring layers 5a and a sealing layer 5b are respectively formed.

Figure 3:
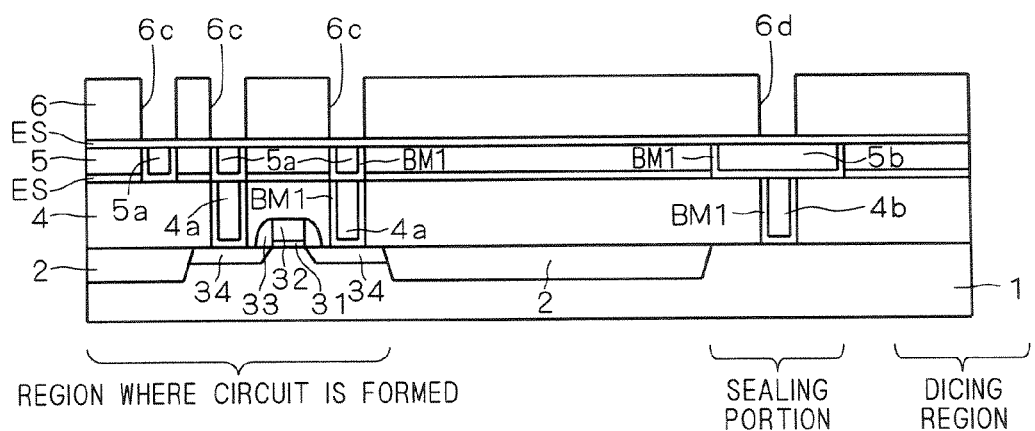

Next, in the step shown in FIG. 3, an SiN film is formed in accordance with, for example, a CVD method so as to cover the entirety of the main surface of the interlayer insulating film 5, and thus, an etching stopper film ES is provided.

After that, an SiOC film is formed on top of the etching stopper film ES in accordance with, for example, a plasma CVD method, and thus, an interlayer insulating film 6 is provided.

Then, a resist mask (not shown) is patterned on top of the interlayer insulating film 6 through a photolithographic process, and this resist mask is used to etch the SiOC film, so that a plurality of holes 6c are provided so as to penetrate the interlayer insulating film 6 in the region where the circuit is formed, and a trench 5d is provided so as to penetrate the interlayer insulating film 6 in the seal ring portion. Here, the trench 5d is provided so as to surround the region where the circuit is formed in the same manner as the sealing layer 4b. Here, some of the plurality of trenches 5c (two in the figure) are provided above the wiring layers 5a, and the trench 5d is provided above the sealing layer 4b.

Figure 4:
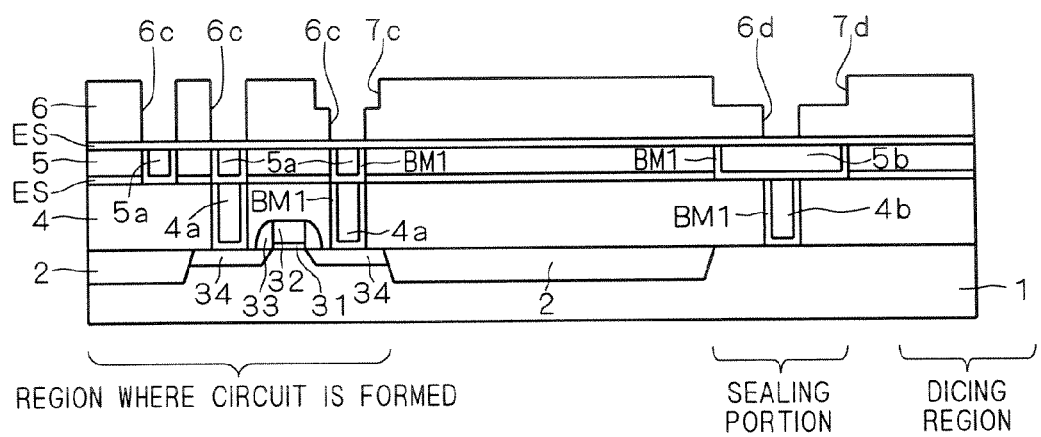

Next, in the step shown in FIG. 4, a resist mask (not shown) is patterned on top of the interlayer insulating film 6 through a photolithographic process, and this resist mask is used etch the SiOC film. A trench 7c is created so as to be communicative connected to a predetermined hole 6c from among the plurality of holes 6c in the region where the circuit is formed, and a trench 7d is created so as to be communicative connected to the trench 6d in the seal ring portion. Here, the trench 7c is a wire trench which coincides with a predetermined wiring pattern, and the trench 7d is provided so as to surround the region where the circuit is formed in the same manner as the sealing layer 4b.

Figure 15:
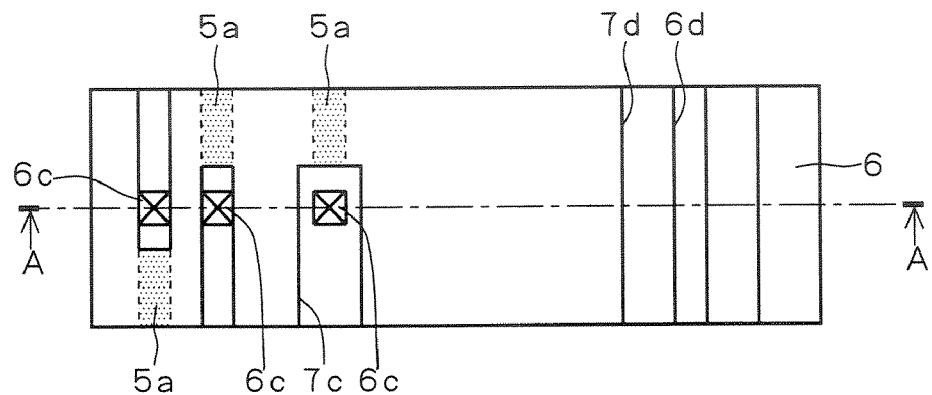
FIG. 15 and FIG. 16 are plan views for illustrating steps in the manufacture of a semiconductor device according to an embodiment of the present invention.

Here, FIG. 15 is a plan diagram showing the interlayer insulating film 6 in a state where the holes 6c and the trenches 7c, 6d and 7d have been created as viewed from the top. Here, FIG. 4 corresponds to the cross sectional diagram along line A-A of FIG. 15.

Figure 5:
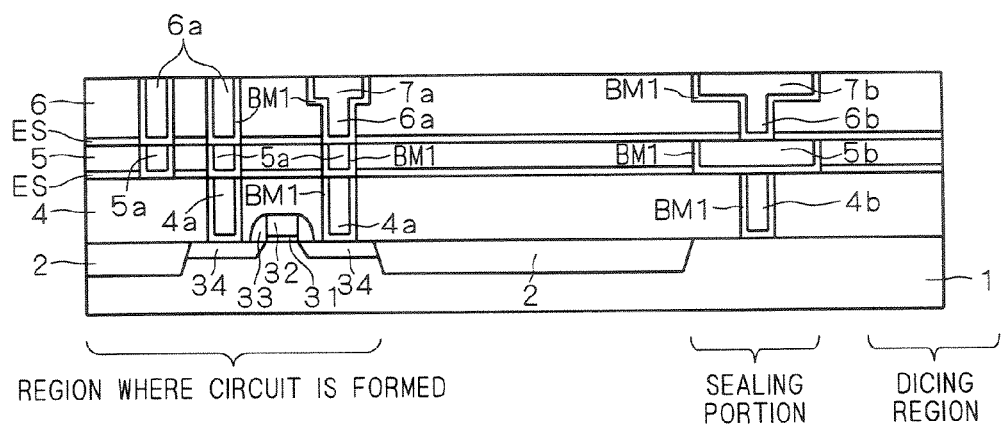

Next, in the step shown in FIG. 5, the etching stopper film ES exposed from the bottom of the holes 6c and the trench 6d is removed under conditions for etching an SiN film so that the hoes 6c and the trench 6d reach the wiring layers 6a and the sealing layer 5b, respectively.

After that, TaN is formed in accordance with a sputtering method so as to cover the inner surfaces of the holes 6c and the trenches 7c, 6d and 7d, and thus, barrier metal layers BM1 are provided, and subsequently, the holes 6c and the trenches 7c, 6d and 7d are filled in with Cu in accordance with a CVD method or a plating method, and thus, the contact portions 6a, the wiring layer 7a and the sealing layers 6b and 7b are respectively formed. One method for simultaneously forming contact portions and wiring layer in the above described manner is a dual damascene method.

Figure 6:
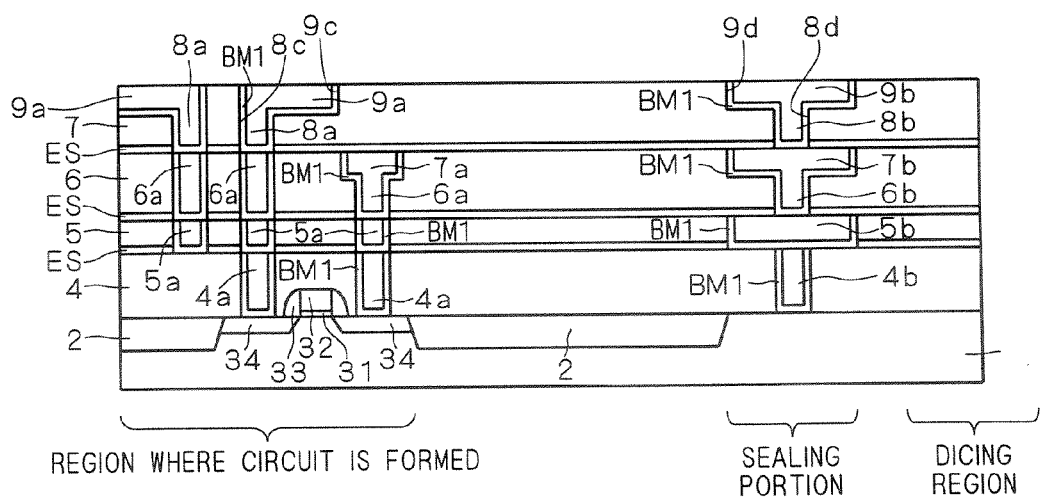

Next, in the step shown in FIG. 6, an SiN film is formed in accordance with, for example, a CVD method, so as to cover the entirety of the main surface of the interlayer insulating film 6, and thus, an etching stopper film ES is provided.

After that, an SiOC film is formed on top of the etching stopper film ES in accordance with, for example, a plasma CVD method, and thus, an interlayer insulating film 7 is provided.

Then, a resist mask (not shown) is patterned on top of the interlayer insulating film 7 through a photolithographic process, and this resist mask is used to etch the SiOC film so that a plurality of holes 8c are provided so as to penetrate the interlayer insulating film 7 in the region where the circuit is formed, and a trench 8d is provided so as to penetrate the interlayer insulating film 7 in the seal ring portion. Here, the trench 8d is provided so as to surround the region where the circuit is formed in the same manner as the sealing layer 4b. Here, some of the plurality of holes 8c (two in the figure) are provided above the contact portions 6a, and the trench 8d is provided above the sealing layer 7b.

Next, a resist mask (not shown) is patterned on top of the interlayer insulating film 7 through a photolithographic process, and this resist mask is used to etch the SiOC film so that trenches 9c are created so as to be communicative connected to predetermined holes 8c from among the plurality of holes 8c in the region where the circuit is formed, and a trench 9d is created so as to be communicative connected to the trench 8d in the seal ring portion. Here, the trenches 9c are wire trenches which coincide with a predetermined wiring pattern, and the trench 9d is provided so as to surround the region where the circuit is formed in the same manner as the sealing layer 4b.

Next, the etching stopper film ES that is exposed from the bottom of the holes 8c and the trench 8d is removed under conditions for etching an SiN film, so that the holes 8c and the trench 8d reach the contact portions 6a and the sealing layer 7b, respectively.

After that, TaN is formed in accordance with a sputtering method so as to cover the inner surfaces of the holes 8c and the trenches 9c, 8d and 9d, and thus, barrier metal layers BM1 are provided, and subsequently, the holes 8c and the trenches 9c, 8d and 9d are filled in with Cu in accordance with a CVD method or a plating method, and thus, the contact portions 8a, the wiring layers 9a and the sealing layers 8b and 9d are respectively formed.

Figure 7:
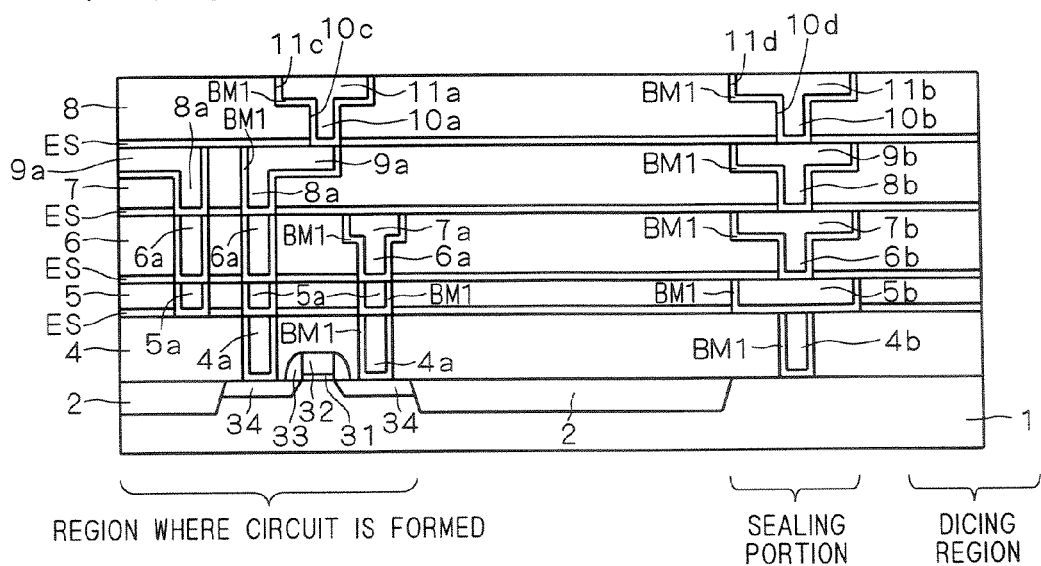

Next, in the step shown in FIG. 7, an SiN film is formed in accordance with, for example, a CVD method, so as to cover the entirety of the main surface of the interlayer insulating film 7, and thus, an etching stopper film ES is provided.

After that, an SiOC film is formed on top of the etching stopper film ES in accordance with, for example, a plasma CVD method, and thus, an interlayer insulating film 8 is provided.

Then, a resist mask (not shown) is patterned on top of the interlayer insulating film 8 through a photolithographic process, and this resist mask is used to etch the SiOC film so that a hole 10c is provided so as to penetrate the interlayer insulating film 8 in the region where the circuit is formed, and a trench 10d is provided so as to penetrate the interlayer insulating film 8 in the seal ring portion. Here, the trench 10d is provided so as to surround the region where the circuit is formed in the same manner as the sealing layer 4b. Here, the hole 10c is provided above a wiring layer 9a, and the trench 10d is provided above the sealing layer 9b.

Next, a resist mask (not shown) is patterned on top of the interlayer insulating film 8 through a photolithographic process, and this resist mask is used to etch the SiOC film so that a trench 11c is created so as to be communicative connected to the hole 10c in the region where the circuit is formed, and a trench 11d is created so as to be communicative connected to the trench 10d in the seal ring portion. Here, the trench 11c is a wire trench which coincides with a predetermined wiring pattern, and the trench 11d is provided so as to surround the region where the circuit is formed in the same manner as the sealing layer 4b.

Next, the etching stopper film ES that is exposed from the bottom of the hole 10c and the trench 10d is removed under conditions for etching an SiN film, so that the hole 10c and the trench 10d reach the wiring layer 9a and the sealing layer 9b, respectively.

After that, TaN is formed in accordance with a sputtering method so as to cover the inner surfaces of the hole 10c and the trenches 11c, 10d and 11d, and thus, barrier metal layers BM1 are provided, and subsequently, the hole 10c and the trenches 11c, 10d and 11d are filled in with Cu in accordance with a CVD method or a plating method, and thus, the contact portion 10a, the wiring layer 11a and the sealing layers 10b and 11b are respectively formed.

Figure 8:
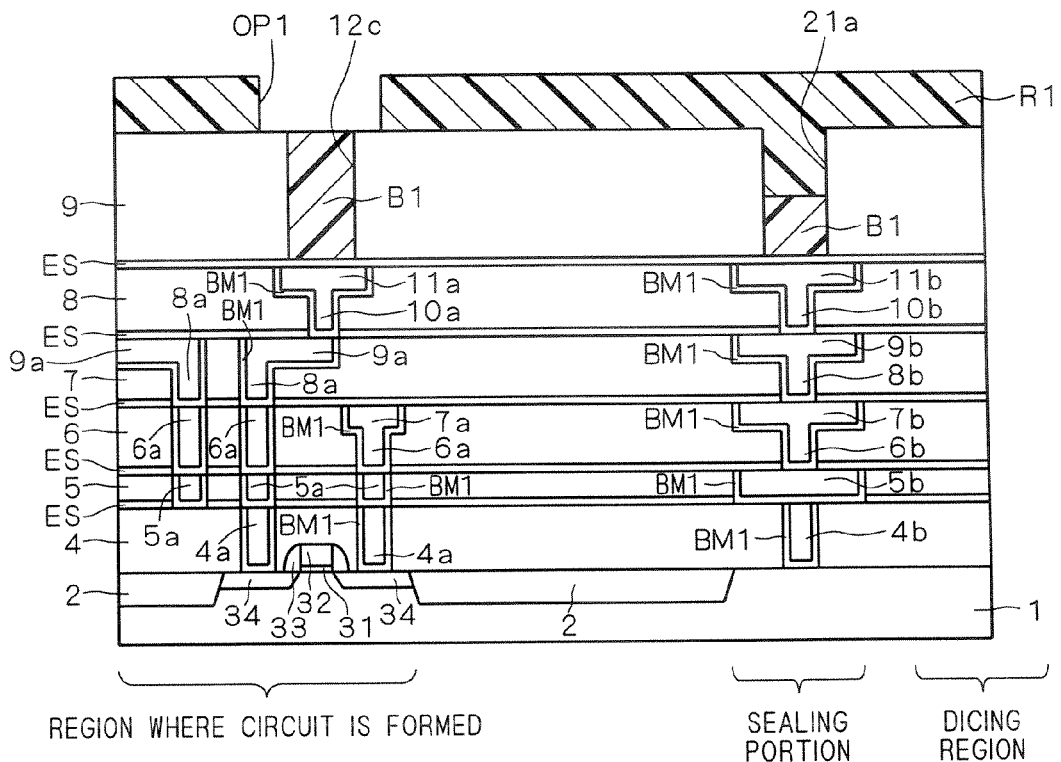

Next, in the step shown in FIG. 8, an SiN film is formed in accordance with, for example, a CVD method, so as to cover the entirety of the main surface of the interlayer insulating film 8, and thus, an etching stopper film ES is provided.

After that, an FSG film is formed on top of the etching stopper film ES in accordance with, for example, a CVD method, and thus, an interlayer insulating film 9 is provided. Here, the thickness of the interlayer insulating film 9 is set to be two or more times greater than the thickness of the interlayer insulating films 6 to 8.

Then, a resist mask (not shown is patterned on top of the interlayer insulating film 9 through a photolithographic process, and this resist mask is used to etch the FSG film so that a hole 12c is provided so as to penetrate the interlayer insulating film 9 in the region where the circuit is formed, and a trench 21a is provided so as to penetrate the interlayer insulating film 9 in the seal ring portion. Here, the trench 21a is provided so as to surround the region where the circuit is formed in the same manner as the sealing layer 4b. Here, the hole 12c is provided above the wiring layer 11a and the trench 21a is provided above the sealing layer 11b.

After that, a resin material is applied to the interlayer insulating film 9, so that the hole 12c and the trench 21a are filled in with a resin layer B1, wherein the volume of the trench 21a is extremely great in comparison with that of the hole 12c, and therefore, it is technically difficult to fill the trench 21a with the resin layer B1, and thus, a state is gained where the trench 21a is not fully filled in with the resin layer B1.

Next, a resist mask R1 is patterned on top of the interlayer insulating film 9 through a photolithographic process. The resist mask R1 has a wiring pattern which coincides with the pattern of the subsequently formed wiring layer 13a, and an opening OP1 is provided in a location corresponding to a portion above the hole 12c. Meanwhile, the trench 21a is filled in with the resist mask R1.

Figure 9:
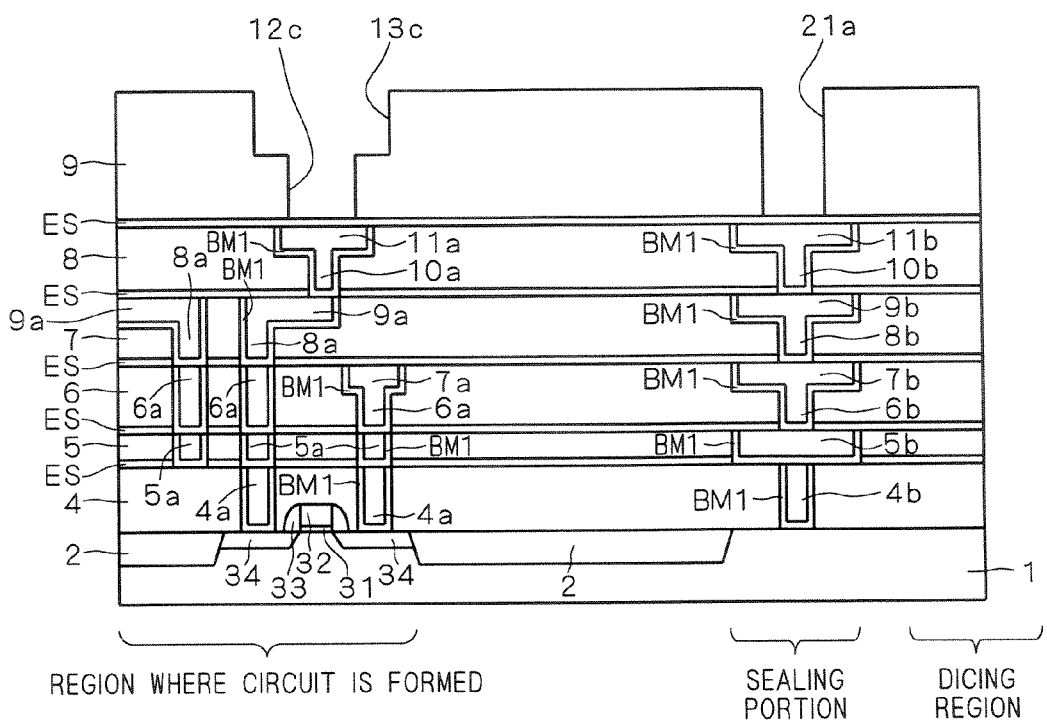

Next, the FSG film is etched using the resist mask R1 and, as shown in FIG. 9, a trench 13c is provided so as to be a wire trench in the region where the circuit is formed. Here, at the time of creation of the trench 13c, the hole 12c is filled in with the resin layer B1, and therefore, the etching stopper film ES and the wiring layer 11a in the lower layer are not exposed to the etchant.

After that, the resist mask R1 and the resin layer B1 are removed, and thereby, the hole 12c and the trench 13c are communicative connected in the region where the circuit is formed, and the trench 21a reemerges in the seal ring portion.

Here, the resin material that forms the resin layer B1 is what remains after a photosensitive component is removed from the resist material, and this can be removed in the step of removing the resist mask R1 through ashing or the like.

Figure 16:
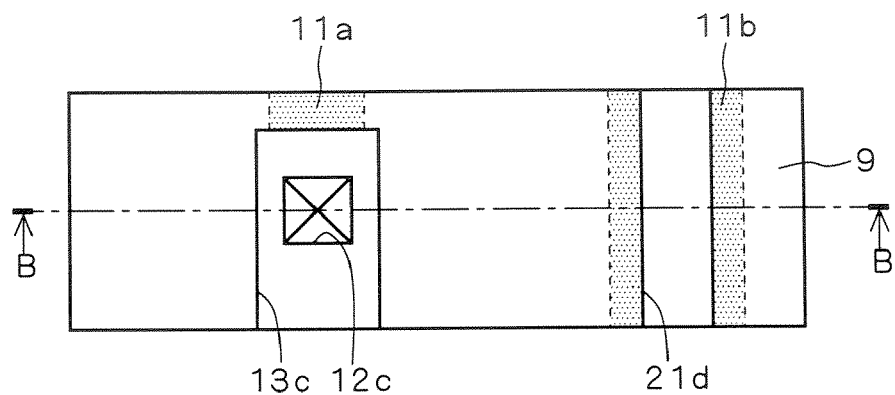
Figure 17:
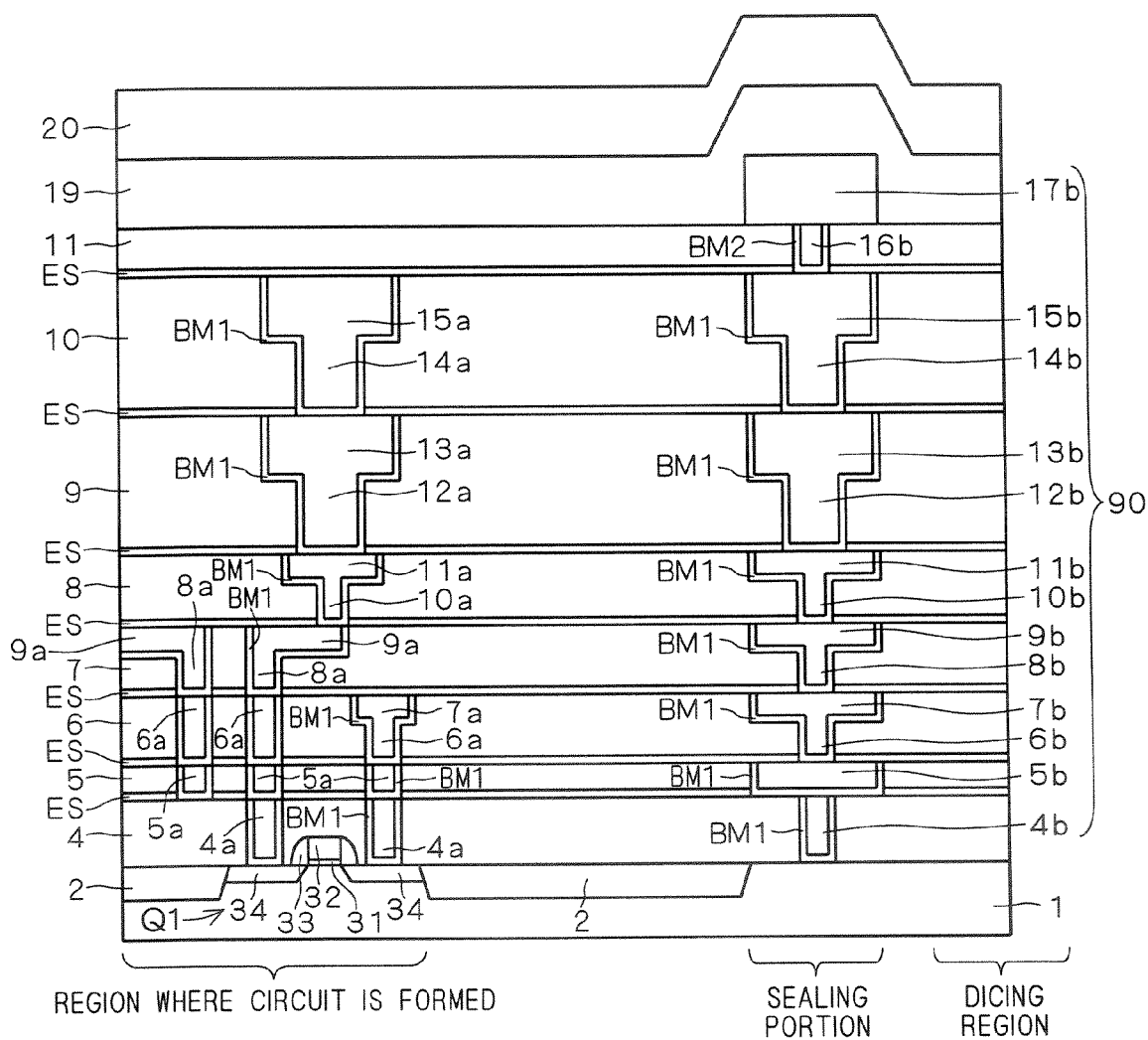
FIG. 17 is a cross sectional view showing the configuration of a conventional semiconductor device.

Here, FIG. 16 is a plan diagram showing the interlayer insulating film 9 in a state where the hole 12c and the trenches 13c and 21d have been created as viewed from the top. Here, FIG. 9 corresponds to a cross sectional diagram along line B-B of FIG. 16.

Figure 10:
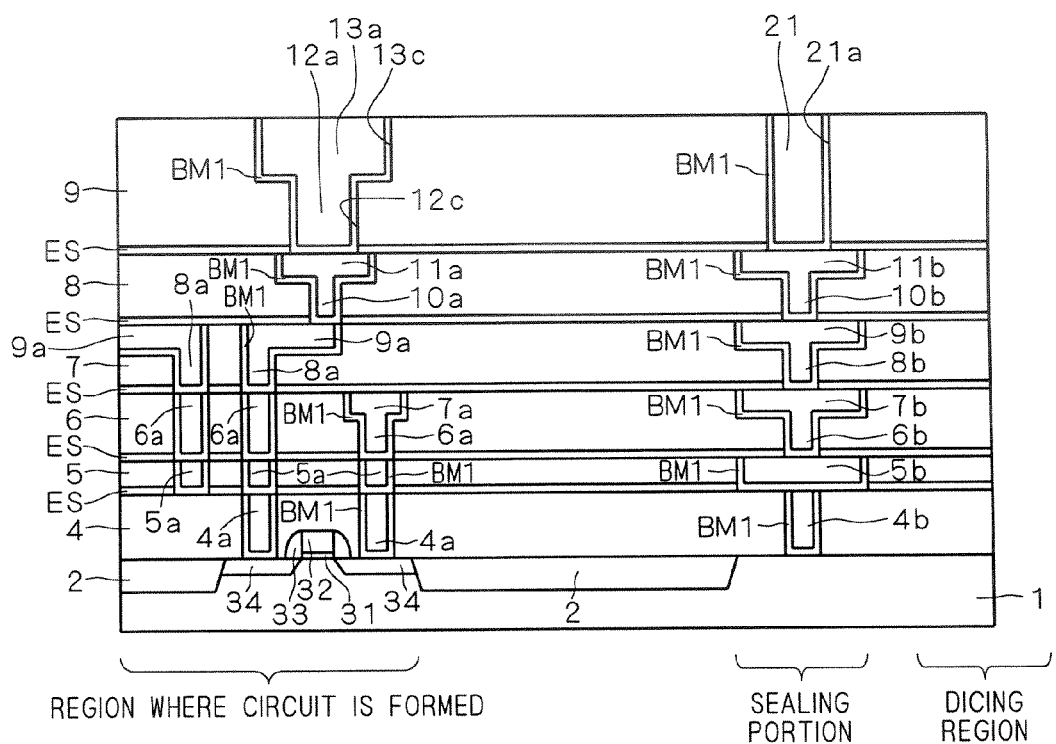

Next, in the step shown in FIG. 10, the etching stopper film ES that is exposed from the bottom of the hole 12c and the trench 21a is removed under conditions for etching an SiN film, so that the hole 12c and the trench 21a reach the wiring layer 11a and the sealing layer 11b, respectively.

After that, TaN is formed in accordance with a sputtering method so as to cover the inner surfaces of the hole 12c and the trenches 13c and 21a, and thus, barrier metal layers BM1 are provided, and subsequently, the hole 12c and the trenches 13c and 21a are filled in with Cu in accordance with a CVD method or a plating method, and thus, the contact portion 12a, the wiring layer 13a and the sealing layer 21 are respectively formed.

Figure 11:
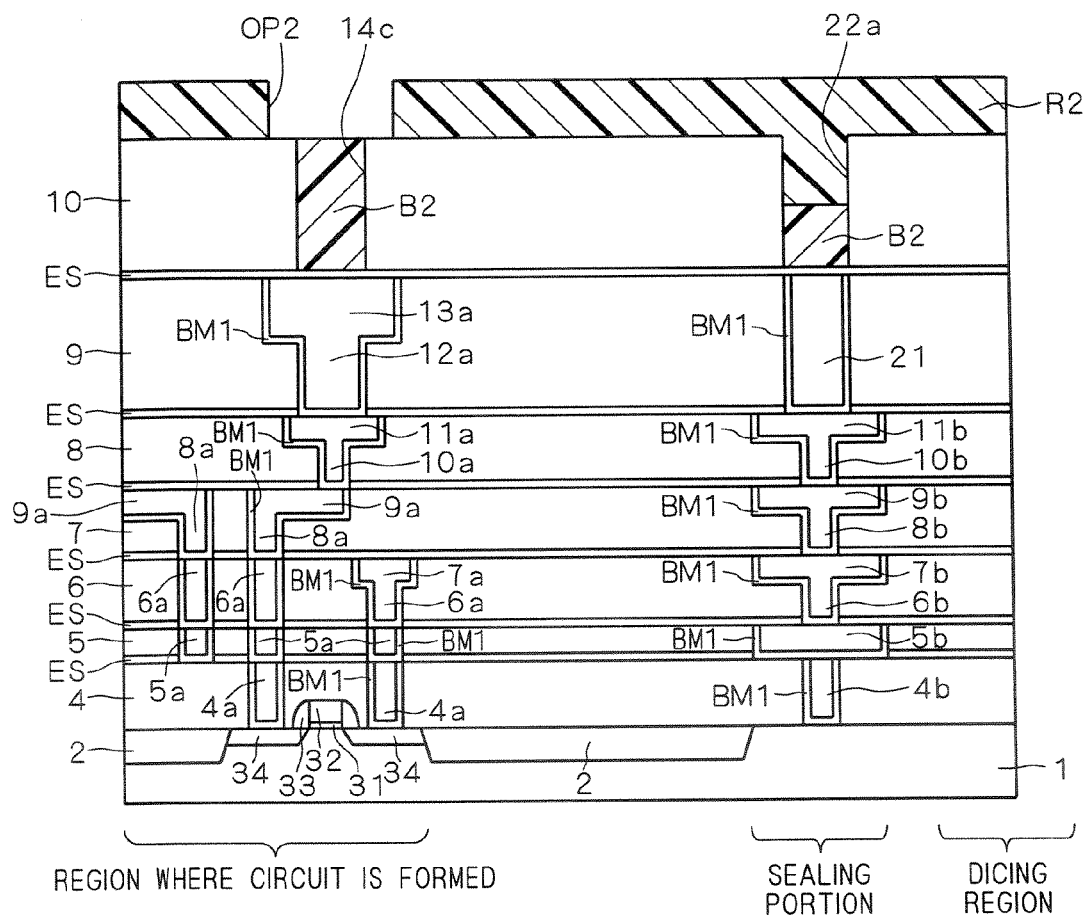

Next, in the step shown in FIG. 11, an SiN film is formed in accordance with, for example, a CVD method, so as to cover the entirety of the main surface of the interlayer insulating film 8, and thus, an etching stopper film ES is provided.

After that, an FSG film is formed on top of the etching stopper film ES in accordance with, for example, a CVD method, and thus, an interlayer insulating film 9 is provided. Here, the thickness of the interlayer insulating film 10 is set to be two or more times greater than the thickness of the interlayer insulating films 6 to 8.

Then, a resist mask (not shown) is patterned on top of the interlayer insulating film 10 through a photolithographic process, and this resist mask is used to etch the FSG film so that a hole 14c is provided so as to penetrate the interlayer insulating film 10 in the region where the circuit is formed, and a trench 22a is provided so as to penetrate the interlayer insulating film 10 in the seal ring portion. Here, the trench 22a is provided so as to surround the region where the circuit is formed in the same manner as the sealing layer 4b. Here, the hole 14c is provided above the wiring layer 13a and the trench 22a is provided above the sealing layer 21.

After that, a resin material is applied to the interlayer insulating film 10, so that the hole 14c and the trench 22a are filled in with a resin layer B2, where the volume of the trench 22a is extremely great in comparison with that of the hole 14c, and therefore, it is technically difficult to fill the trench 22a with the resin layer B2, and thus, a state is gained where the trench 22a is not fully filled in with the resin layer B2.

Next, a resist mask R2 is patterned on top of the interlayer insulating film 10 through a photolithographic process. The resist mask R2 has a wiring pattern which coincides with the pattern of the subsequently formed wiring layer 15a, and an opening OP2 is provided in a location that corresponds to a portion above the hole 14c. Meanwhile, the trench 22a is filled in with the resist mask R2.

Next, the resist mask R2 is used to etch the FSG film and, as shown in FIG. 12, a trench 15c which becomes a wire trench is provided in the region where the circuit is formed. Here, at the time of creation of the trench 15c, the hole 14c is filled in with the resin layer B2, and therefore, the etching stopper film ES and the wiring layer 13a in the lower layer are not exposed to the etchant.

After that, the resist mask R2 and the resin layer B2 are removed, and thereby, the hole 14c and the trench 15c are communicative connected in the region where the circuit is formed, and the trench 22a reemerges in the seal ring portion.

Figure 13:
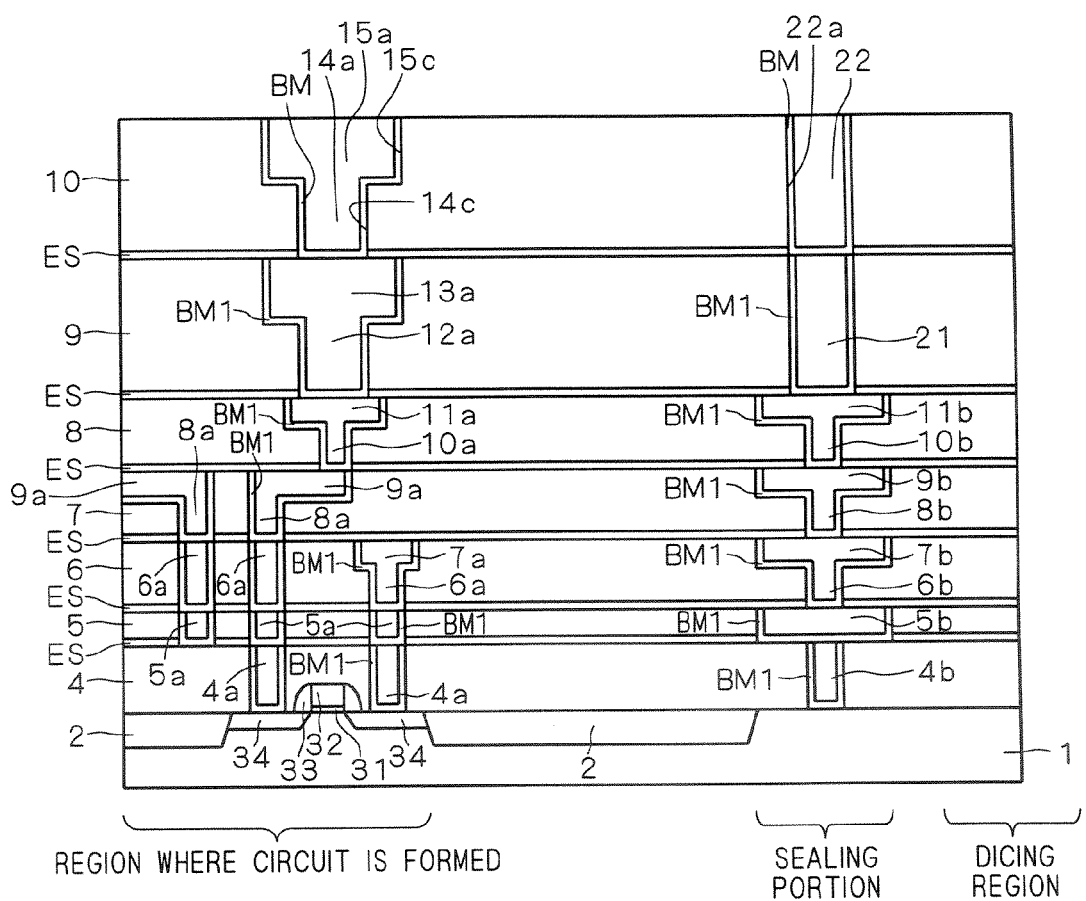

Next, in the step shown in FIG. 13, the etching stopper film ES that is exposed from the bottom of the hole 14c and the trench 22a is removed under conditions for etching an SiN film, so that the hole 14c and the trench 22a reach the wiring layer 13a and the sealing layer 13b, respectively.

After that, TaN is formed in accordance with a sputtering method so as to cover the inner surfaces of the hole 14c and the trenches 15c and 22a, and thus, barrier metal layers BM1 are provided, and subsequently, the hole 14c and the trenches 15c and 22a are filled in with Cu in accordance with a CVD method or a plating method, and thus, the contact portion 14a, the wiring layer 15a and the sealing layer 22 are respectively formed.

Figure 14:
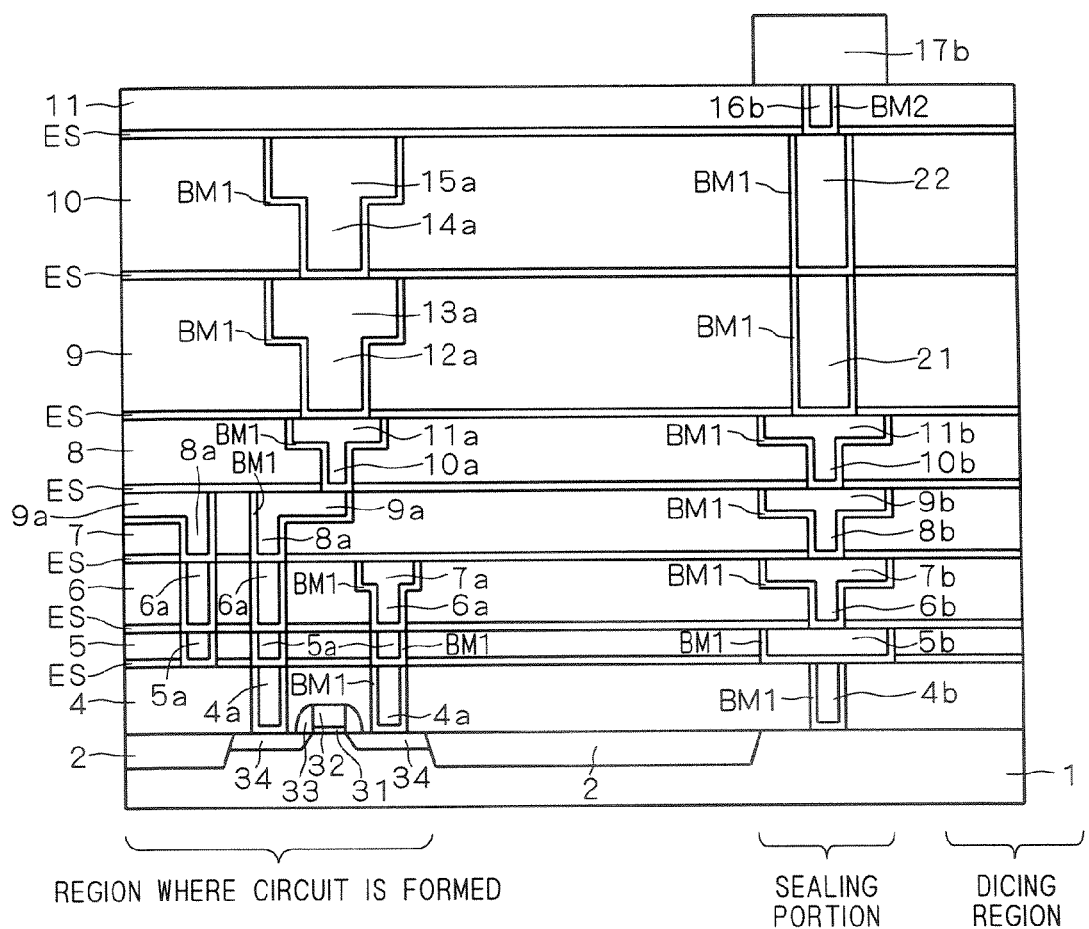

Next, in the step shown in FIG. 14, an SiN film is formed in accordance with, for example, a CVD method, so as to cover the entirety of the main surface of the interlayer insulating film 10, and thus, an etching stopper film ES is provided.

After that, an FSG film is formed on top of the etching stopper film ES in accordance with, for example, a CVD method, and thus, an interlayer insulating film 11 is provided.

Then, a resist mask (not shown) is patterned on top of the interlayer insulating film 11 through a photolithographic process, and this resist mask is used to etch the FSG film so that a trench 16d is provided so as to penetrate the interlayer insulating film 11 in the seal ring portion. Here, the trench 16d is provided so as to surround the region where the circuit is formed in the same manner as the sealing layer 4b. Here, the trench 16d is provided above the sealing layer 15b.

Next, the etching stopper film ES that is exposed from the bottom of the trench 16d is removed under conditions for etching an SiN film, so that the trench 16d reaches the sealing layer 15b.

Here, holes are also created so as to reach the wiring layer 16a in the process for the trench 16d in a portion of the region where the circuit is formed which is not shown in FIG. 14.

After that, TiN is formed in accordance with a sputtering method so as to cover the inner surfaces of the trench 16d, and thus, a barrier metal layer BM2 is provided, and subsequently, the trench 16d is filled in with tungsten in accordance with, for example, a sputtering method, and thus, a sealing layer 16b is formed.

Next, a sealing layer 17b is formed of aluminum on top of the interlayer insulating film 11 in accordance with, for example, a sputtering method, so as to cover the sealing layer 16b. Here, the sealing layer 17b is provided so as to surround the region where the circuit is formed in the same manner as the sealing layer 4b.

Here, wiring layers (seventh layer wires) which are the top layers are also formed in the process for the sealing layer 17b in a portion of the region where the circuit is formed which is not shown in FIG. 14.

After that, a silicon nitride film is formed through, for example, plasma nitrization, so as to cover the interlayer insulating film 11, including the sealing layer 17b, and thus, a passivation film 19 is provided, and a polyimide film 20 is provided on top of the passivation film 19, and thereby, a semiconductor device having a seal ring 100 is completed.

<Effects>

In the above described semiconductor device having a seal ring 100, a conventionally used configuration, where sealing layers of which the cross sectional form is in T-shape are layered, is used up to the interlayer insulating film 8, where the fourth layer wires are formed, and a configuration where sealing layers of which the cross sectional form is rectangular are layered is used in the interlayer insulating films 9 and 10, where the fifth and sixth layer wires are formed.

That is to say, a function as a barrier against the penetration of moisture from the cut section along the dicing portion and the spreading of cracks is required as a function of a seal ring, and therefore, it is desirable for the size in the horizontal direction, that is to say, in the direction parallel to the main surface of the semiconductor substrate 1, to be great and for the physical strength to be great, and thus, the width of the sealing layers 5b, 7b, 9b and 11b which are formed on top of the sealing layers 4b, 6b, 8b and 10b, respectively, is made greater than that of the latter.

The wires from the fourth layer down are designed in accordance with the local wiring rule and/or intermediate wiring rule, which makes the width of the contact portions no greater than 0.3 µm, and therefore, it is particularly desirable to increase the width of the sealing layers 5b, 7b, 9b and 11b, and thus increase the physical strength.

In addition, the interlayer insulating films 6 to 8, where the second to fourth layer wires are respectively formed, are formed of an SiOC film having a relative dielectric constant of no greater than 3.0, and when the relative dielectric constant is as low as this, the adhesiveness between the interlayer insulating films is low, and the interlayer insulating films easily peel in the cut section along the dicing portion.

However, the volume of the Cu which is used as a filling is increased by increasing the width of the sealing layers 5b, 7b, 9b and 11b in these interlayer insulating films 6 to 8, and thereby, the effects of preventing the interlayer insulating films 6 to 8 from peeling are enhanced.

Meanwhile, the fifth and sixth layer wires are designed in accordance with the semi-global wiring rule and/or global wiring rule, and thus, the width of the contact portions becomes no less than 0.3 µm, and therefore, the cross sectional form of the sealing layers 21 and 22 is made rectangular, and the width thereof is made the same as the width of the contact portions, and thereby, physical strength which is sufficient for counterworking penetration of moisture and spreading of cracks can be gained.

In addition, it is technically difficult to fill the trenches 21a and 22a with a resin material for the formation of the sealing layers 21 and 22 as described with reference to FIGS. 8 and 11. In particular, the thickness of the interlayer insulating films 9 and 10 is two or more times greater than the thickness of the interlayer insulating films 6 to 8, and therefore, a phenomenon where the trenches 21a and 22a have an extremely large volume and cannot be filled in with a resin material frequently occurs, in comparison with the sealing layers 6b, 8b and 10b which are formed in the interlayer insulating films 6 to 8.

In the case where trenches having a greater width than the trenches 21a and 22a are attempted to be created in a continuous manner by applying a dual damascene method in this state, the etching stopper film and the sealing layer in the lower layer are exposed to the etchant in a state where the trenches 21a and 22a are not filled in with a resin material, and thus, there is a possibility that the already formed sealing layer in the lower layer may be partially removed through etching.

However, only part of the process in accordance with a dual damascene method is used in forming of the sealing layers 21 and 22, and therefore, the connection portion between the sealing layer in the upper layer and the sealing layer in the lower layer does not become fragile, and the function as a seal ring does not deteriorate.

In addition, the interlayer insulating films 9 and 10, in which the fifth and sixth layer wires are respectively formed, are formed of an FSG film of which the relative dielectric constant is approximately 3.5, and therefore, the adhesiveness between the interlayer insulating films is higher than that between the interlayer insulating films 6 to 8, and it is difficult for the interlayer insulating films to peel. Accordingly, it is possible to prevent the interlayer insulating films 9 and 10 from peeling, even though the cross sectional form of the sealing layers 21 and 22 is rectangular.

Here, though in the above description, an example of wire layers in a seven layer structure is shown, and an example where sealing layers of which the cross sectional form is in T-shape are provided in interlayer insulating films where wire layers formed in accordance with the local wiring rule and/or intermediate wiring rule are provided and sealing layers of which the cross sectional form is rectangular are provided in interlayer insulating films where wire layers formed in accordance with the semi-global wiring rule and/or global wiring rule are provided is described, the applications for the present invention are not limited to this, and the plurality of wiring layers, and the wiring rules is not limited and the above described effects can be gained as long as sealing layers of which the cross sectional form is in T-shape (first sealing layers) are provided beneath sealing layers of which the cross sectional form is rectangular (second sealing layers).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor integrated circuit provided on a semiconductor substrate;
multilevel wiring layers that are formed on the semiconductor substrate and are provided above a region where a circuit is formed; and
a seal ring provided so as to surround the periphery of said region and said multilevel wiring layers, wherein
the multilevel wiring layers include a plurality of first wiring layers and a plurality of second wiring layers, each of the first wiring layers including a first interlayer insulating film, each of the second wiring layers including a second interlayer insulating film, and a plurality of the second wiring layers formed over a plurality of the first wiring layers,
the seal ring includes a plurality of first seal rings and a plurality of second seal rings, each of the first seal rings is formed in the first interlayer insulating film, each of the second seal rings is formed in the second interlayer insulating layer, and the plurality of the second seal rings are formed above a plurality of the first seal rings,
a first cross sectional form of each of the first seal rings is a predetermined shape,
a second cross sectional form of each of the second seal rings is rectangular,
a first relative dielectric constant of each of said first interlayer insulating films is smaller than 3.5, and a second relative dielectric constant of each of said second interlayer insulating films is no less than 3.5,
the seal ring of which a cross sectional form is not rectangular is formed in the first insulating film,
the predetermined shape has a leg portion and a seal portion arranged above the leg portion,
a first width of the leg portion is narrower than a second width of the seal portion,
each of the plurality of second seal rings penetrates a respective of the second interlayer insulating films,
each of the plurality of second seal rings includes a copper metal and a barrier metal formed on a side wall of the copper metal and on a bottom of the copper metal,
a plurality of second wirings are formed such that each second wiring is formed in a respective of the second interlayer insulating films just beside a respective of the second seal rings, and
a contact portion connects between two adjacent of the second wirings, the contact portion formed just beside the respective of the second seal rings.

2. The semiconductor device according to claim 1, wherein:
in plan view, the leg portion surrounds the periphery of said region, and
in plan view, a plurality of the first seal rings and a plurality of the second seal rings overlap each other.

3. The semiconductor device according to claim 1, wherein:
the first width of the leg portion is no greater than 0.3 μm, and
the second width is two or more times greater the than first width of the leg portion.

4. The semiconductor device according to claim 3, wherein:
the first seal ring is formed of the same material as a first wiring formed in the first interlayer insulating film, and
the plurality of second seal rings are formed of the same material as a second wiring formed in the second interlayer insulating film.

5. The semiconductor device according to claim 4, wherein:
the first width of the leg portion is the same as a fourth width of a first contact portion for connecting between one of the first wiring and another of the first wiring adjacent to one of the first wiring, and
a third width of said second sealing layers is the same as a fifth width of a second contact portion.

6. The semiconductor device according to claim 1, wherein:
the multilevel wiring layers include a predetermined layer formed between the semiconductor substrate and a plurality of the first wiring layers, the predetermined layer including a third interlayer insulating film of which a third relative dielectric constant is no less than 3.5,
the seal ring includes a third seal ring formed in the third interlayer insulating film, and
a third contact portion is formed in the third interlayer insulating film and contacts a semiconductor element formed on the semiconductor substrate.

* * * * *